United States Patent [19]

Sturzebecher et al.

[11] Patent Number: 5,162,657

[45] Date of Patent: Nov. 10, 1992

[54] OPTICAL CONTROL OF A MICROWAVE SWITCH

[75] Inventors: Dana J. Sturzebecher, Tinton Falls; Arthur Paolella, Howell; Thomas P. Higgins, Tinton Falls, all of N.J.

[73] Assignee: The United States of America as represented by the Secretary of the Army, Washington, D.C.

[21] Appl. No.: 788,630

[22] Filed: Nov. 6, 1991

[51] Int. Cl.$^5$ .......................................... G02B 27/00
[52] U.S. Cl. .................................... 250/551; 307/311
[58] Field of Search ........ 250/214 R, 214 SW, 214 A, 250/227.11, 214 DC, 551; 307/117, 311; 359/127, 128, 181, 184, 188; 330/285, 286

[56] References Cited

U.S. PATENT DOCUMENTS

| | | | |
|---|---|---|---|
| 4,369,371 | 1/1983 | Hara et al. | 250/551 |
| 4,570,079 | 2/1986 | Davis | 250/551 |
| 4,595,881 | 6/1986 | Kennan | 330/286 |
| 4,859,965 | 8/1989 | Paolella et al. | 330/285 |
| 5,001,355 | 3/1991 | Rosen et al. | 307/311 |
| 5,012,084 | 4/1991 | Guiberteau et al. | 250/551 |
| 5,012,097 | 4/1991 | Oda | 250/551 |
| 5,073,718 | 12/1991 | Paolella | 307/311 |
| 5,086,281 | 2/1992 | Paolella | 330/285 |

Primary Examiner—David C. Nelms
Assistant Examiner—S. Allen
Attorney, Agent, or Firm—Michael Zelenka; William H. Anderson

[57] ABSTRACT

An optical controlled attenuator circuit for controlling a microwave variable attenuator. The optical controlled attenuator circuit includes, a light source, a control connected to the light source, an optic fiber having an end coupled to the light source, a field effect transistor coupled to a second end of the optic fiber, a first inverting amplifier coupled to the field effect transistor, a second non-inverting amplifier coupled to the first amplifier means, a third non-inverting amplifier coupled to the second amplifier, a fourth inverting amplifier means also coupled to the second amplifier, and a microwave variable attenuator having first and second inputs respectively coupled to the fourth inverting amplifier and to the third non-inverting amplifier means and having an RF input and an RF output.

5 Claims, 1 Drawing Sheet

OPTICAL CONTROL OF A MICROWAVE SWITCH

GOVERNMENTAL INTEREST

The invention described herein may be manufactured, used, and licensed by or for the Government for governmental purposes without the payment to us of any royalty thereon.

FIELD OF THE INVENTION

The invention relates in general to an optical control of a microwave variable attenuator, and particularly to an optical control of a microwave variable attenuator using four amplifiers and an optical detector and an optical fiber.

BACKGROUND OF THE INVENTION

The prior art optical control is described in U.S. Pat. No. 4,859,965, issued Aug. 22, 1989. The prior art optical control includes a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, dc amplifier means having an input coupled to a circuit junction of said fixed resistance and said FET and having an output, a GaAs MMIC distributed amplifier having a dc bias control coupled to the output of the dc amplifier means, whereby changes in the intensity of light from said light source change the voltage drop across said FET and the input applied to said dc amplifier means to thereby change the gains of said MMIC distributed amplifier.

One problem with the prior art optical control is that it is not suitable for controlling a microwave variable attenuator.

A related publication is by Paolella, A., Madjar, A., Herozfeld, P., Sturzebecher, D., entitled "Optically Controlled GaAs MMIC Switch using a MESFET as an Optical Detector", 1990 IEEE MTT-S International Microwave Symposium Digest, Volume II.

A related patent application is Ser. No. 07/604,081, filed Oct. 15, 1990, entitled "Optical Control of a Microwave Switch, of inventors, Sturzebecher, D., and Paolella, A.

SUMMARY OF THE INVENTION

According to the present invention, an optical control of a microwave variable attenuator is provided. This optical control comprises, a light source for emitting light at a wavelength in the region of 0.5 micrometers to 1 micrometer, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, first inverting dc amplifier means having an input coupled to a circuit junction of said fixed resistance and said FET and having an output, and having another input for receiving a reference voltage, second non-inverting dc amplifier means having an input coupled to the output of the first amplifier means and having an output and having another input for receiving a reference voltage; third inverting dc amplifier means having an input coupled to the output of the second amplifier means and having an output and having another input for receiving a reference voltage; fourth non-inverting dc amplifier means having an input also coupled to said output of the second amplifier means and having an output and having another input for receiving a reference voltage; and a GaAs attenuator unit having an input coupled to the output of the third inverting dc amplifier means and having another input coupled to the output of the fourth non-inverting amplifier means and having an RF input line, and having an RF output line, whereby changes in the intensity of light from said light source change the voltage drop across said FET and change the signal applied to said first and second dc amplifier means and the signals applied to said third and fourth dc amplifier means and then change the signals applied to said GaAs attenuator to thereby change the signal in the RF output line.

By using the first and second and third and fourth amplifier means, and the arrangement described, a suitable optical control is provided for controlling a microwave variable attenuator.

BRIEF DESCRIPTION OF THE DRAWINGS

These and other objects, features and details of the invention will become apparent in light of the ensuing detailed disclosure, and particularly in light of the drawings wherein.

DESCRIPTION OF THE PREFERRED EMBODIMENT

Figure 1:
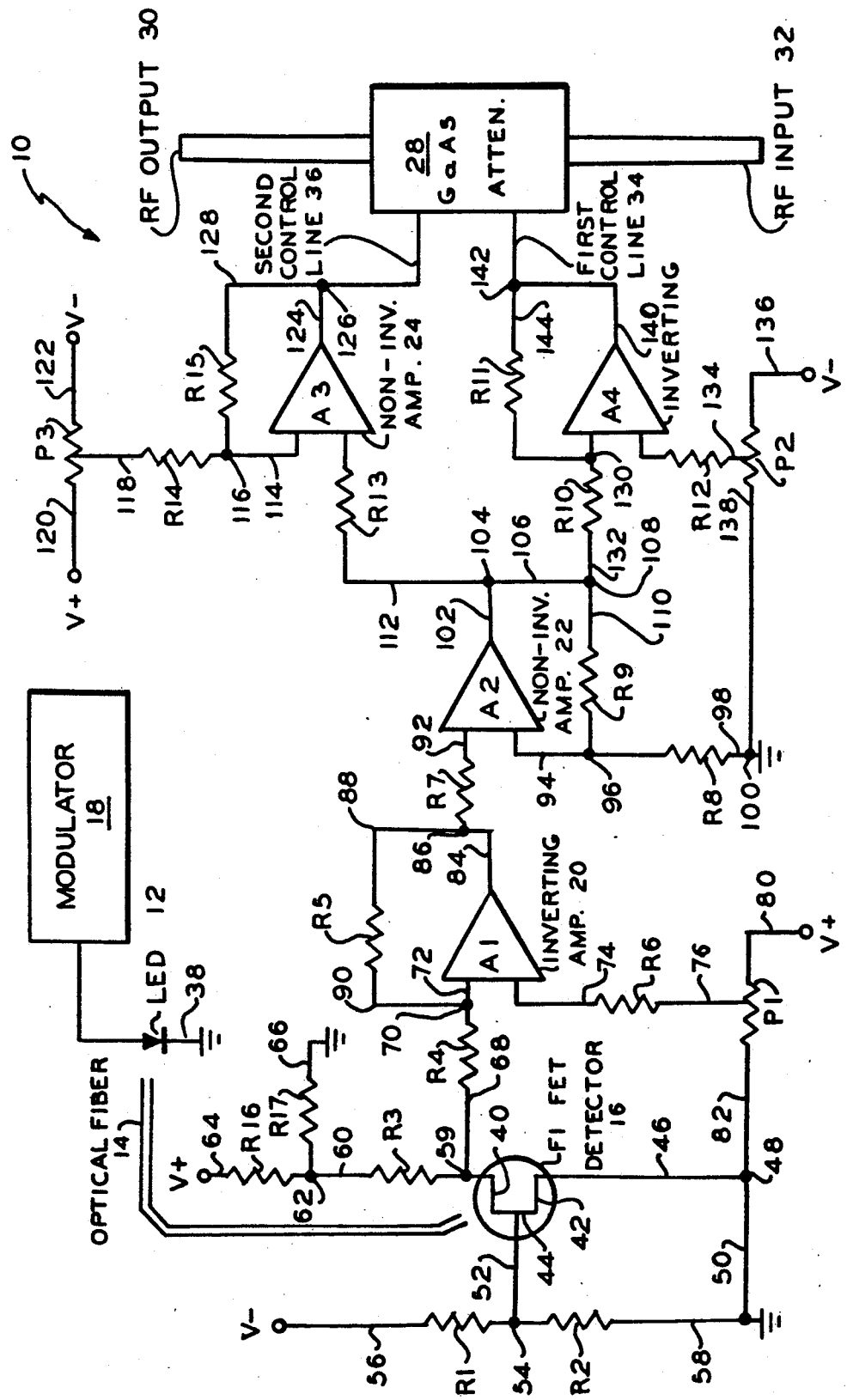
FIG. 1 is a schematic circuit diagram of an optically controlled variable attenuator circuit according to the present invention.

As shown in FIG. 1, an optically controlled variable attenuator circuit or assembly or system 10 is provided. Circuit 10 includes a light source or light emitting diode or LED 12, an optic fiber or 1 km optic fiber 14, and an optical detector or gallium arsenide (GaAs) MESFET or microwave monolithic integrated circuit (MMIC) field effect transistor FET 16. Light source 12 has a modulator 18.

Circuit 10 also includes a first A1 Bi-FET inverting op-amp or amplifier 20, a second A2 Bi-FET non-inverting amplifier 22, a third A3 Bi-FET non-inverting amplifier 24, and a fourth A4 Bi-FET inverting amplifier 26.

Circuit 10 also includes a gallium arsenide (GaAs) microwave variable attenuator or GaAs microwave monolithic integrated circuit (MMIC) variable attenuator 28. Attenuator 28 has an RF output or an RF output 50 ohm microstrip transmission line 30. Attenuator 28 also has an RF input 32. Attenuator 28 also has a first control line 34 and has a second control line 36.

Light source 12 should emit light at a wavelength in the region of 0.5 micrometers to 1 micrometers because light in this wavelength region is capable of altering the performance of a GaAs FET. As illustrated in FIG. 1, light source 12 may comprise a light emitting diode (LED), such as the pig-tailed LED manufactured by Laser Diode, Inc., No. IRE-160 FA, for example. This LED is capable of producing 300 microwatts of power at a wavelength of 835 nanometers. The intensity of the light from the LED 12 may be varied by a modulator 18, which acts as the control means for the optical control circuit of the invention.

Light source 12 is connected in series circuit with modulator 18 across a source of positive dc voltage (not shown) by means of a lead or wire 38.

Optic fiber 14 is optically coupled to LED light source 12 and to the FET, indicated generally as 16. If the aforementioned pig-tailed LED is utilized as the light source, the pig-tail itself is an optic fiber and may be used as the optic fiber 14 in the circuit of the invention. This fiber is a multi-mode optic fiber with a core diameter of 100 micrometers and a cladding diameter of 140 micrometers.

The FET 16 should be a GaAs multi-finger FET having parallel connected drains 40, parallel connected sources 42, and parallel connected gate fingers 44. A suitable FET, for example, would be NEC NE 868196 which has 14 gate fingers connected to a single gate bonding pad. The end of the optic fiber 14 which is coupled to FET 16 should focus the light from the source 12 on the active surface of the FET 16 between the sources and drains of the FET and the focus light spot should cover substantially all of the gate fingers of the FET.

The parallel connected drains 40 and parallel connected sources 42 of the FET 16 are connected in a series circuit. The parallel connected sources 42 connect through lead 46 to circuit junction 48 then through lead 50 to ground.

The parallel connected gates 44 connect through a lead 52 and a circuit junction 54 and a gate biasing resistance or resistor R1 and lead 56 to a source V− of negative dc voltage which should be of sufficient magnitude to bias the FET 16 to a point near pinch-off of the FET 16. Circuit junction 54 also connects to a gate biasing resistance R2 which connects through a lead 58 to ground. Pinch-off is usually defined as the value of gate voltage that causes the drain current of the FET to be at about 10% of its full value. This is done to maximize the light sensitivity of the FET 16 because it has been found that the maximum change in operating performance of a GaAs FET in response to light directed onto the surface of the FET occurs at a point at or near pinch-off.

The parallel connected drains 40 connect through a circuit junction 59, a resistance R3, a lead 60, a circuit junction 62, a resistance R16, a lead 64, in that order, to a source of positive voltage V+.

The circuit junction 62 between resistance R3 and resistance R16 connects through a resistance R17 and a lead 66 to ground. Resistance R3, R16 and R17 supply the reference voltage for drains 40.

The circuit junction 58 between the serially connected FET 16 and the resistance R3 is connected by means of a lead 68, a resistance R4, a circuit junction 70, and a lead 72 to the first input of the first inverting dc operational amplifier 20.

The first A1 inverting operational amplifier 20 has its second input connected to a source of positive voltage V+ by means of a lead 74, a resistance R6, a lead 76, a potentiometer P1 and a lead 80. The input signal applied to the inverting operational amplifier 20 through resistance R4 is essentially the drain to source voltage of the FET 16. Potentiometer 78 connects through a lead 82 to circuit junction 48. The output of the first inverting operational amplifier 20 is coupled in a feedback loop to its first input by means of a lead 84, junction 86, a lead 88, a resistance R5, a lead 90, the junction 70, and the lead 72. The gain of inverting amplifier 20 is determined by the resistances R4 and R5. The inverting dc operational amplifier 20 may comprise, for example, a GaAs or bipolar operational amplifier, such as No. AD 840 JN which is manufactured by Analog Devices.

The second A2 non-inverting amplifier 22 has its first input connected through a lead 92 and a resistance R7 to circuit junction 86. Second amplifier 22 has its second input connected through a lead 94, a circuit junction 96, a resistance R8, a lead 98, and a circuit junction 100 to ground. Second amplifier has an output connected through a lead 102 to a circuit junction 104. Circuit junction 104 connects through a lead 106 to a circuit junction 108, which connects through a lead 110 and resistance R9 to circuit junction 96. Resistances R8 and R9 supply the gain for second non-inverting amplifier 22.

The third A3 non-inverting amplifier 24 has its first input connected through a resistance R13 and a lead 112 to circuit junction 104, which connects through the lead 102 to the output of second amplifier 20. Third amplifier 24 has its second input connected through a lead 114, a circuit junction 116, a resistance R14, a lead 118 to a potentiometer P3. Potentiometer P3 has a lead 120 connected to a source V+ of positive voltage. Potentiometer P3 has another lead 122 to a source V− of negative voltage. Third amplifier 24 has its output connected to a lead 124, a circuit junction 126, and the control line 36 of attenuator 28. Circuit junction 126 connects through a lead 128 and a resistance R15 to circuit junction 116. Resistances R14 and R15 and potentiometer P3 supply the gain and reference voltage to third amplifier 24.

The fourth A4 inverting amplifier 26 has its first input connected through a circuit junction 130, a resistance R10 and a lead 132 to circuit junction 108, which connects through lead 106 and circuit junction 104 and lead 102 to the output of second amplifier 22. Fourth amplifier 26 has its second input connected through a resistance R12 and a lead 134 to a potentiometer P2. Potentiometer P2 has a first lead 136 connected to a source V− of negative voltage. Potentiometer P2 has a second lead 138 connected to circuit junction 100. Fourth amplifier 26 has its output connected to a lead 140 and a circuit junction 142 to the first control line 34 of attenuator 28. Circuit junction 142 connects through a lead 144 and a resistance R11 to circuit junction 130 which connects to the first input of fourth amplifier 26. Resistances R10 and R11 supply the gain for fourth amplifier 26. Potentiometer P2 and resistance R12 supply the reference voltage to fourth amplifier 26.

In operation, circuit 10 operates in the following manner. The MESFET optical detector 16 is biased at pinch-off. The biasing to the gate circuit is provided by resistors or resistances R1 and R2. The ratio is set such that the FET 16 is at pinch-off, which is at a gate-tosource voltage ($V_{GS}$) equal to −3.75 volts, in this embodiment. The biasing to the drain circuit is provided by resistances R16 and R17. The ratio is such that at pinch-off the drain-to-source voltage ($V_{DS}$) is 3.0 volts. As the optical illumination increases, the device begins to conduct current through resistance R3 and the required change in drain-to-source voltage ($V_{DS}$) of 3.0 to 2.3 volts is achieved. The optical source 12 used to illuminate the FET 16 is a LED operating at a peak wavelength of 835 nm. The light is coupled through the multi-mode fiber 14 with core-cladding diameters of 100 and 140 mm respectively. The optical power needed to provide the total 0.7 volt change is only 25 uw.

The drain of the MESFET 16 is connected to the A1 Bi-FET operational amplifier or op-amp 20, operating in the inverting mode. The gain of amplifier 20 is set by resistances R4 and R5 at 2.5. A reference voltage of 2.3 volts is set on the non-inverting input of the A1 operational amplifier 20 by potentiometer P1 and resistance R6. This is done so that the output of A1 amplifier 20 will only vary between 0 and −1.75 volts. The output of A1 amplifier 20 is connected to the non-inverting input of A2 amplifier 22, which is operating in the non-inverting mode. The gain of A2 amplifier 22 is controlled by resistance R8 and resistance R9 and is set at 2.

The output of the second A2 operational amplifier 22 is connected to the inverting input of the fourth A4 amplifier 26, thus operating in the inverting mode, and the non-inverting terminal of the third A3 amplifier 24, thus operating in the non-inverting mode. The gain of A4 amplifier 26 is set by resistances R10 and R11, and the gain of A3 amplifier 24 is set by resistances R14 and R15, both gains are set such that they are equal to 2. Potentiometers P3 and P2 set the voltage reference values of A3 amplifier 24 and A4 amplifier 26. Potentiometer P3 is set so that there is 0 volts on the inverting terminal of A3 amplifier 24, and potentiometer P2 is set so that there is −3.5 volts on the non-inverting terminal of A4 amplifier 26.

When the above conditions are satisfied, output to control lines 34, 36 will only vary between 0 volts and −7 volts. These two control lines 34, 36 are connected to the GaAs variable attenuator 28. First control line 34 varies between 0 volts and −7 volts, and second control line 36 varies between −7 volts and 0 volts. When first control line 34 equals 0 volts and second control line 36 equals −7 volts, there is no attenuation through the device 28; and this is the state when there is no light incident upon MESFET 16. When the MESFET 16 is illuminated, the drain to source voltage $V_{DS}$ changes from 3.0 volts to 2.3 volts in 0.1 volt increments. The value of the increments depends upon the attenuation wanted. The control circuit 10, when tested alone, was able to switch states at a rate of 100 KHz. This rate was limited by the Gain Bandwidth Product of the low cost Bi-FET operating amplifiers 20, 22, 24, 26 which are used in circuit 10.

The advantages of circuit 10 are indicated hereafter.

A) The circuit 10 can be used for high speed attenuation.

B) The circuit 10 can optically control a microwave variable attenuator 28 which is a GaAs MMIC attenuator.

C) The circuit 10 can be used for remotely controlling a microwave attenuator 28 in a relatively high electromagnetic interference type of environment.

D) The circuit 10 can be used to control a microwave attenuator 28 using a fiber optic link 14 and a FET detector 16.

While the invention has been described in its preferred embodiment, it is to be understood that the words which have been used are words of description rather than limitation and that changes may be made within the purview of the appended claims without departing from the true scope and spirit of the invention in its broader aspects.

For example, the LED light source 12 can be replaced by a high speed laser for faster switching.

What is claimed is:

1. An optical controlled attenuator circuit comprising:

a light source for emitting light at a wavelength in the region of 0.5 micrometers to 1.0 micrometer;

control means coupled to said light source for controlling the intensity of the light emitted from said source;

a fixed resistance;

a GaAs multi-finger FET having parallel connected sources and parallel connected drains and parallel connected gate fingers;

circuit means for connecting the sources and drains of said FET in series circuit with said fixed resistance across a source of positive dc voltage;

means optically coupled from said light source on the surface of said FET between the sources and drains of the FET and covering substantially all of the gate fingers of the FET;

gate biasing means coupled to the gates of said FET for biasing said FET to a point near pinch-off to maximize the light sensitivity of the FET;

first inverting dc amplifier means having an input coupled to a circuit junction of said fixed resistance and said FET and having an output and having another input for receiving a reference voltage;

second non-inverting dc amplifier means having an input coupled to the output of the first amplifier means and having an output and having another input for receiving a reference voltage;

third inverting dc amplifier means having an input coupled to the output of the second amplifier means and having an output and having another input for receiving a reference voltage;

fourth non-inverting dc amplifier means having an input also coupled to said output of the second amplifier means and having an output and having another input for receiving a reference voltage; and an attenuator unit having an input coupled to the output of the third inverting dc amplifier means and having another input coupled to the output of the fourth non-inverting dc amplifier means and having an RF input and having an RF output, whereby changes in the intensity of light from said light source change the voltage drop across said FET and change the signals applied to said first and fourth inverting dc amplifier means and to said second and third non-inverting dc amplifier means and change the signals applied to said attenuator unit to thereby change the signals applied to the RF output.

2. The optical controlled attenuator circuit of claim 1, wherein said attenuator unit is a gallium arsenide (GaAs) microwave monolithic integrated circuit (MMIC) attenuator unit.

3. The optical controlled attenuator circuit of claim 1, wherein said first and third and fourth amplifier reference voltage inputs each is connected through a resistance to a potentiometer.

4. The optical controlled attenuator circuit of claim 1, wherein said means optically coupled to said light source and said FET for focussing light from said light source on the surface of said FET is an optical fiber.

5. The optical controlled attenuator circuit of claim 1, wherein said light source is a light emitting diode.

* * * * *

UNITED STATES PATENT AND TRADEMARK OFFICE
CERTIFICATE OF CORRECTION

PATENT NO. : 5,162,657

DATED : Nov. 10, 1992

INVENTOR(S) : DANA J. STURZEBECHER, ARTHUR PAOLELLA, THOMAS P. HIGGINS

It is certified that error appears in the above-identified patent and that said Letters Patent is hereby corrected as shown below:

On the title page, item [54] and in col. 1, line 2, in the title
    Line 2, delete "SWITCH" and add --VARIABLE ATTENUATOR--.

Signed and Sealed this

Twenty-first Day of December, 1993

*Attest:*

BRUCE LEHMAN

*Attesting Officer*     *Commissioner of Patents and Trademarks*